(12) United States Patent
Mehrad

(10) Patent No.: US 6,268,248 B1
(45) Date of Patent: Jul. 31, 2001

(54) METHOD OF FABRICATING A SOURCE LINE IN FLASH MEMORY HAVING STI STRUCTURES

(75) Inventor: Freidoon Mehrad, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/215,478

(22) Filed: Dec. 18, 1998

Related U.S. Application Data

(60) Provisional application No. 60/068,543, filed on Dec. 23, 1997.

(51) Int. Cl.[7] .................................................. H01L 21/336
(52) U.S. Cl. ........................ 438/262; 438/423; 438/433; 257/401
(58) Field of Search ..................................... 438/405, 424, 438/426, 427, 433, 246, 247, 248, 257, 262, 423

(56) References Cited

U.S. PATENT DOCUMENTS

| | | | |
|---|---|---|---|
| 4,894,695 | * | 1/1990 | Ishii et al. ............................ 438/248 |
| 5,045,490 | * | 9/1991 | Esquivel et al. ..................... 438/589 |
| 5,366,925 | * | 11/1994 | Lur et al. .............................. 438/427 |
| 5,501,993 | * | 3/1996 | Borland ................................ 438/228 |
| 5,858,839 | * | 1/1999 | Kaya et al. .......................... 438/257 |
| 5,877,537 | * | 3/1999 | Aoki ..................................... 257/390 |
| 5,998,263 | * | 12/1999 | Sekariapuram et al. ............ 438/259 |
| 6,066,885 | * | 5/2000 | Fulford, Jr. et al. ................. 257/508 |
| 6,090,712 | * | 7/2000 | Lyons et al. ......................... 438/691 |

* cited by examiner

Primary Examiner—Olik Chaudhuri
Assistant Examiner—William David Coleman
(74) Attorney, Agent, or Firm—Peter K. McLarty; W. James Brady, III; Frederick J. Telecky, Jr.

(57) ABSTRACT

A method of forming a semiconductor component having a conductive line (24) that crosses a trench (72) may include forming the trench (72) in a semiconductor substrate (52). A dopant may be implanted at a first energy level into the semiconductor substrate (52) to form a first conductive region (92). The dopant may be implanted at a second energy level into the semiconductor substrate (52) to form a second conductive region (94). The first energy level may be greater than the second energy level. The first conductive region (92) and the second conductive region (94) may form the conductive line (24).

11 Claims, 3 Drawing Sheets

METHOD OF FABRICATING A SOURCE LINE IN FLASH MEMORY HAVING STI STRUCTURES

This application claims priority under 35 USC § 119 (e) (1) of provisional application number 60/068,543, filed Dec. 23, 1997.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing spacing between each of the various semiconductor devices. The decrease in spacing allows a larger number of such microelectronic devices to be formed on the semiconductor substrate. As a result, the computing power and speed of the semiconductor component may be greatly improved.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

The floating gate transistors are electrically isolated from one another by an isolation structure. One type of isolation structure used is a LOCal Oxidation of Silicon (LOCOS) structure. LOCOS structures are generally formed by thermally growing a localized oxidation layer between the cells to electrically isolate the cells. One problem with the LOCOS structure is that the structure includes non-functional areas that waste valuable space on the semiconductor substrate.

Another type of isolation structure used is a Shallow Trench Isolation (STI). STI structures are generally formed by etching a trench between the, cells and filling the trench with a suitable dielectric material. STI structures are smaller than LOCOS structures and allow the cells to be spaced closer together to increase the density of cells in the array. However, STI structures are often not used in FLASH memory due to the difficulty in forming the source line that connects the cells in each row. The source line in FLASH memory utilizing STI structures often has a higher resistance than a corresponding FLASH memory that uses LOCOS structures. The increased electrical resistance reduces the operational performance of the memory.

SUMMARY OF THE INVENTION

Accordingly, a need has arisen for an improved source line for flash memory using an STI structure and method of construction. The present invention provides an improved source line for flash memory using an STI structure and method of construction that substantially eliminates or reduces problems associated with the prior methods and systems.

In accordance with one embodiment of the present invention an improved method of forming a semiconductor device component having a conductive line that crosses a trench includes forming the trench in a semiconductor substrate. A dopant is implanted at a first energy level into the semiconductor substrate to form a first conductive region. The dopant is also implanted at a second energy level into the semiconductor substrate to form a second conductive region wherein the first energy level is greater than the second energy level. The first and second conductive regions together form the conductive line.

Important technical advantages of the present invention include fabricating a source line with shallow trench isolation structures, wherein the source line has an electrical resistance that is comparable with that of a source line fabricated by some conventional processes. In addition, the electrical resistance of the source line may be lower than that of a corresponding source line fabricated using a LOCOS isolation structure.

Other technical advantages will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 6 illustrates various aspects of an electronic device and the fabrication of a source line used within the electronic device. As described in greater detail below, three individual processes for fabricating a source line are disclosed. Each of these three processes may be used individually or in combination with the other processes to fabricate a source line having a reduced electrical resistance. The first process forms the source line by implanting a dopant into a semiconductor substrate at multiple energy levels. The second process forms the source line by implanting the dopant into the semiconductor substrate at an angle. The third process utilizes an STI structure that has a trapezoidal cross section.

Figure 1:
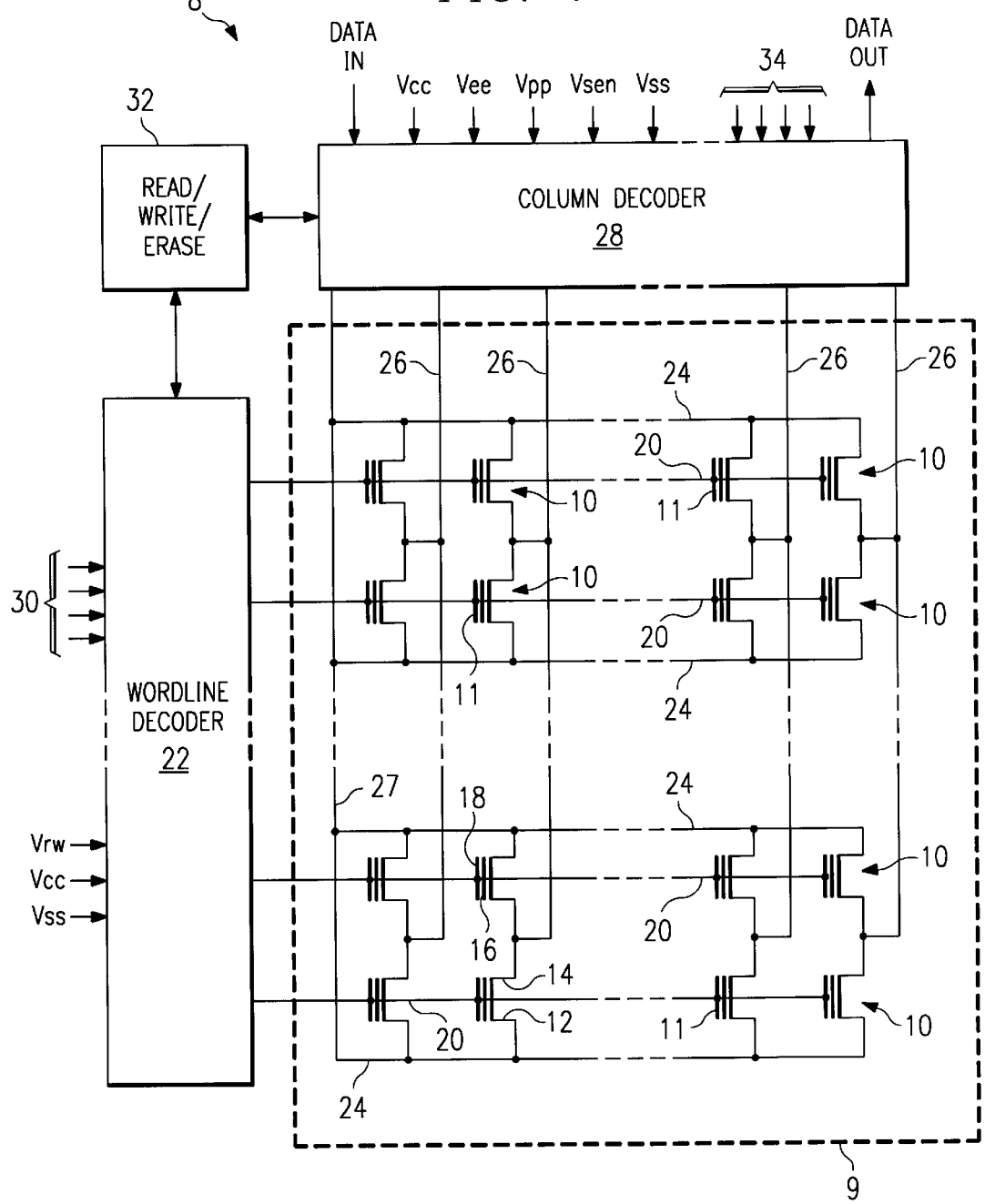
FIG. 1 is an electrical schematic diagram, in partial block diagram form, of an electronic device which includes a memory cell array in accordance with the present invention.

FIG. 1 is an electrical schematic diagram, in partial block form, of an electronic device 8 in accordance with one embodiment of the present invention. The electronic device 8 includes a wordline decoder 22, a column decoder 28, a Read/Write/Erase control circuit 32 for controlling the decoders 22 and 28, and a memory cell array 9. The memory cell array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12V, on a selected wordline 20, which us coupled to the control gate 18 of a selected cell 10. Column decoder 28 also functions to place a second programming voltage $V_{pp}$, approximately +5 to +10V, on a selected drain-column line 26 and, therefore, the drain 14 of the selected cell 10. Source lines 24 are coupled to a reference potential $V_{ss}$ through line 27. All of the deselected drain-column lines 26 are coupled to the reference potential $V_{ss}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2V to −6V with respect to the gate region. For memory cells 10 fabricated in accordance with one embodiment of the present invention, the coupling coefficient between the control gate 18, the wordline 20, and the floating gate 16 is approximately 0.5. Therefore, a programming voltage $V_{RW}$ of 12 volts, for example, on a selected wordline 20, which includes the selected gate control 18, places a voltage of approximately +5 to +6V on the selected floating gate 16. The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{ss}$. The column decoder 28 also functions to apply a high positive voltage $V_{EE}$ approximately +10V to +15V, to all of the source lines 24. These erasing voltages create sufficient field strength across the tunneling area between floating gate 16 and the semiconductor substrate to generate a Fowler-Nordheim tunnel current that transfers charge from the floating gate 16, erasing the memory cell 10.

In the read mode, the wordline decoder 22 functions, in response to wordline address signals on lines 30 and to signals from Read/Write/Erase control circuit 32, to apply a preselected positive voltage $V_{cc}$, approximately +5V, to the selected wordline 20, and to apply a low voltage, ground or $V_{ss}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
| --- | --- | --- | --- |
| Selected Wordline | 5V | 12V | 0V (All) |
| Deselected Word lines | 0V | 0V | — |
| Selected Drain Line | 1.0V | 5–10V | Float (All) |
| Deselected Drain Lines | Float | 0V | — |
| Source lines | 0V | About 0V | 10–15V (All) |

Figure 2:
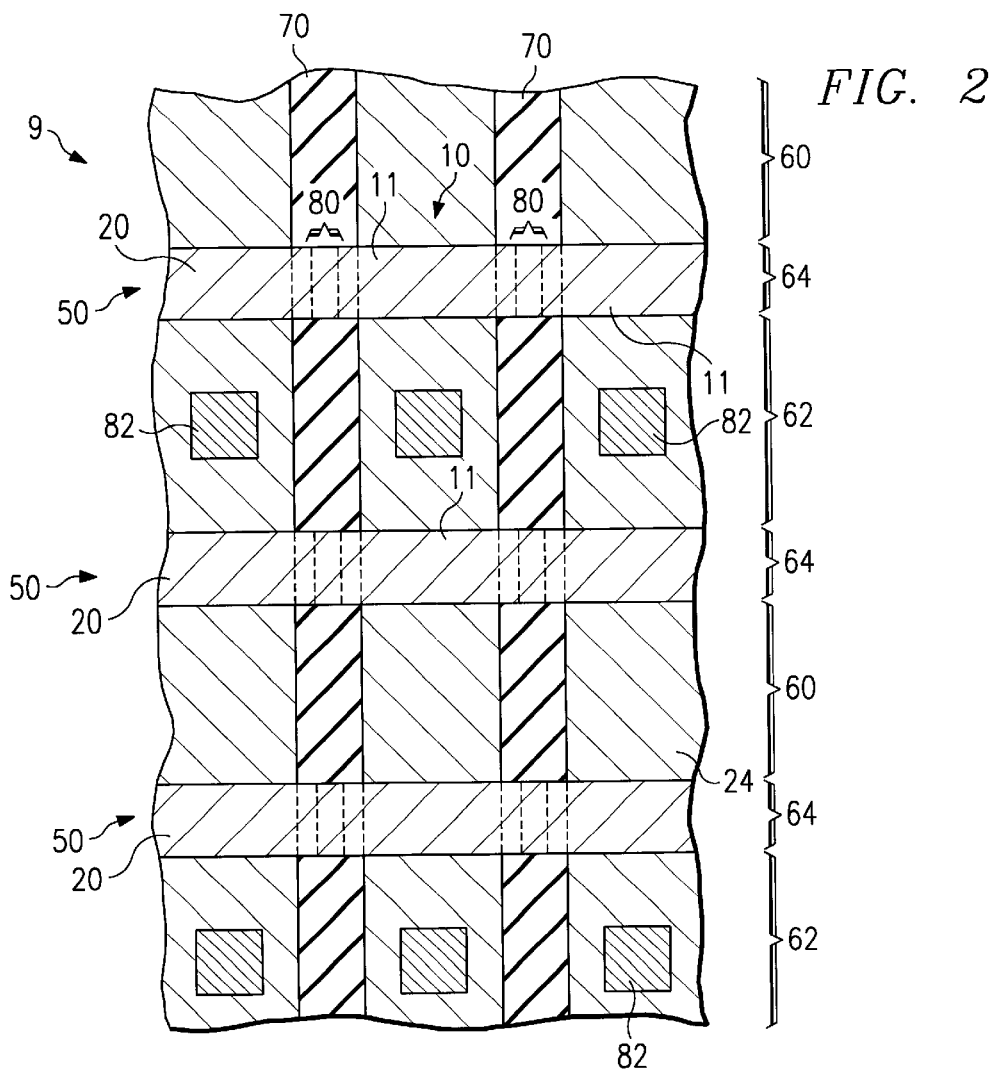
FIG. 2 is an enlarged plan view of a portion of the memory cell of FIG. 1 array in accordance with the present invention.
Figure 3:
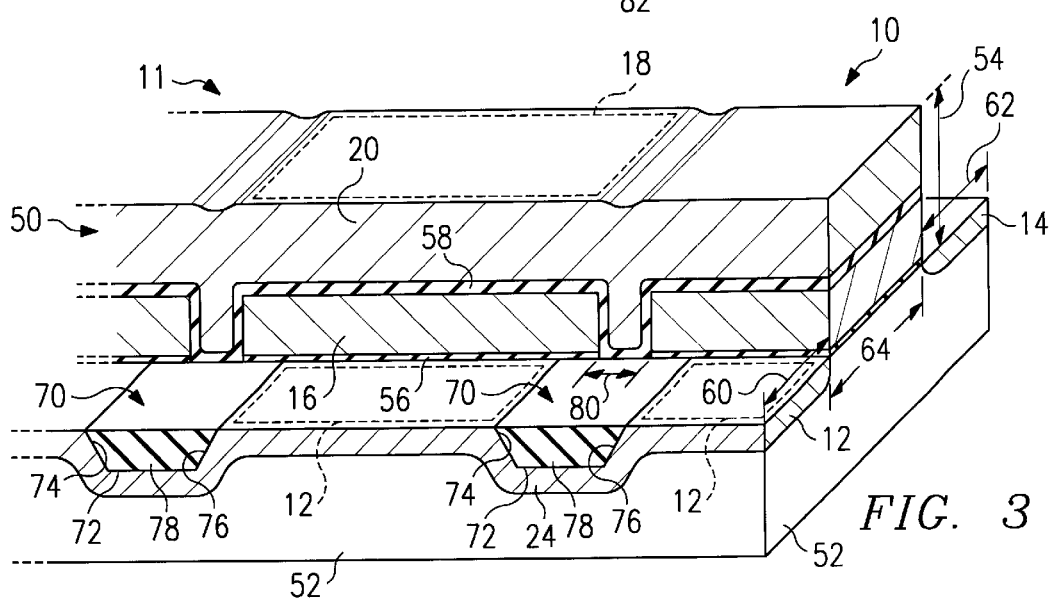
FIG. 3 is a perspective view of a portion of the memory cell array of FIG. 2 in accordance with the present invention.

FIGS. 2 and 3 illustrate the structure of a portion of the memory array 9 illustrated in FIG. 1. Specifically, FIG. 2 is an enlarged plan view of a portion of a memory array 9, and FIG. 3 is a perspective view of a portion of the memory array 9 illustrated in FIG. 2. As discussed previously, the memory array 9 includes a number of memory cells 10 arranged in rows and columns.

As best illustrated in FIG. 3, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by a shallow trench isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. However, it will be understood that the semiconductor substrate 52 may comprise other suitable materials or layers without departing from the scope of the present invention. For example, the semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 3, the floating gate transistors 11 in each continuous stack structure 50 in the memory array 9 are electrically isolated from one another by the shallow trench isolation (STI) structure 70. The STI structures 70 are generally formed prior to the fabrication of the gate stack 54 on the semiconductor substrate 52. The STI structures 70 are formed by etching a trench 72 into the semiconductor substrate 52. The trench 72 is generally on the order of 0.3 to 8.5 μm in depth. The trench 72 comprises a first sidewall surface 74 and a second sidewall surface 76. As discussed in greater detail below, the sidewall surfaces 74 and 76 may be fabricated at an angle to vary the cross-sectional shape of the trench 72.

The trench 72 is then filled with a trench dielectric material 78 to electrically isolate the active regions of the semiconductor substrate 52 between the STI structures 70. The trench dielectric material 78 may comprise silicon dioxide, silicon nitride, or a combination thereof. The trench dielectric material 78 is generally etched back, followed by a deglaze process to clean the surface of the semiconductor substrate 52 prior to fabrication of the gate stack 54. It will be understood that the trench dielectric material 78 may comprise other suitable dielectric materials without departing from the scope of the present invention.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 3, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 100 to 500 Å in thickness. It will be understood that the gate insulator 56 may comprise other materials suitable for insulating semiconductor elements.

The floating gate 16 and the control gate 18 are conductive regions. The gates 16 and 18 generally comprise a polycrystalline silicon material (polysilicon) that is in-situ doped with impurities to render the polysilicon conductive. The thicknesses of the gates 16 and 18 are generally on the order of 100 nanometers and 300 nanometers, respectively. It will be understood that the gates 16 and 18 may comprise other suitable conductive materials without departing from the scope of the present invention.

The interstitial dielectric 58 may comprise oxide, nitride, or a heterostructure formed by alternating layers of oxide and nitride. The interstitial dielectric 58 is on the order of 20 to 40 nanometers in thickness. It will be understood that the interstitial dielectric 58 may comprise other materials suitable for insulating semiconductor elements.

As best illustrated in FIG. 2, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. In one embodiment, the floating gates 16 in adjacent memory cells 10 are isolated by a gap 80. The gap 80 is generally etched into a layer of conductive material (not shown) that is used to form the floating gate 16.

The source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 3, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 3, the source line 24 crosses the STI structures 70 in the source region 60 of the semiconductor substrate 52 below the STI structures 70. In contrast, the STI structures 70 electrically isolate the adjacent floating gate transistors 11 in the channel region 64 of the semiconductor substrate.

The source line 24, and correspondingly the sources 12 of each floating gate transistor 11, is generally fabricated after at least a portion of the gate stack 54 has been fabricated. The gate stack 54 is pattern masked (not shown) using conventional photolithography techniques, leaving the semiconductor substrate 52, proximate the source region 60, exposed. The exposed region of the semiconductor substrate 52 is then etched to remove the trench dielectric material 78 in the exposed region. The etching process to remove the trench dielectric material 78 may be an anisotropic etching process. Anisotropic etching may be performed using a reactive ion etch (RIE) process using carbon-fluorine based gases such as $CF_4$ or $CHF_3$.

The semiconductor substrate 52 proximate the source region 60, including that portion of the semiconductor substrate 52 forming the trench 72, is doped with impurities to render the region conductive. The conductive region is then thermally treated to diffuse the impurities into the source region 60 of the semiconductor substrate 52. The diffused conductive region forms both the source 12 of each floating gate transistor 11 as well as the source line 24. The source region 60 of the semiconductor substrate 52 is generally doped by an implantation process in which dopant ions are impacted into the semiconductor substrate 52. As will be discussed in greater detail below, the implantation process may be varied to form the source line 24.

Figure 4:
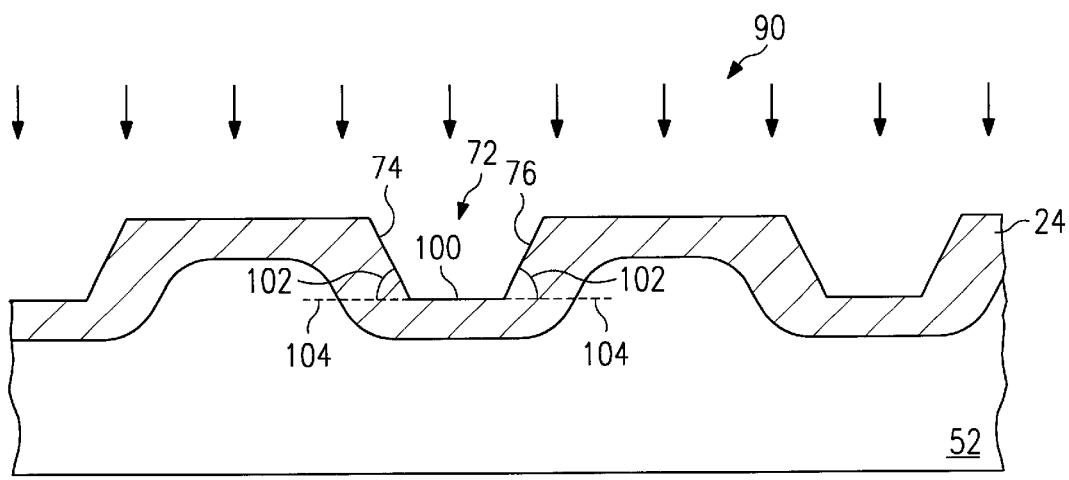
FIG. 4 is a cross section of a semiconductor substrate illustrating the fabrication of a source line using an angled sidewall trench in accordance with one embodiment of the present invention.

FIG. 4 is a cross section of the semiconductor substrate 52 illustrating the fabrication of a source line 24 with an angled sidewall trench 72 in accordance with one embodiment of the present invention. In this embodiment, the trench 72 is fabricated with a trapezoidal cross section such that the short parallel surface of the trapezoid corresponds to a trench base surface 100 of the trench 72. The first sidewall surface 74 and the second sidewall surface 76 are fabricated with a sidewall angle 102 from an axis 104 parallel to a surface of the semiconductor substrate 52. In one embodiment, the sidewall angle 102 is approximately 80°. It will be understood that the sidewall angle 102 may be varied between 45° and 85° without departing from the scope of the present invention.

The trapezoidal cross section of the trench 72 reduces the discontinuity which would otherwise occur in the implanted conductive region forming the source line 24. The increased continuity of the implanted conductive region reduces the electrical resistance of the source line 24. The increased continuity and the reduced resistance are a result of the increased amount of dopant that is implanted into the semiconductor substrate 52 proximate the sidewall surfaces 74 and 76 due to the trapezoidal cross section of the trench 72. The trapezoidal cross section of the trench 72 provides a gradual angled-transition into the trench 72 as compared to the radical step-transition used in some STI structures.

Figure 5:
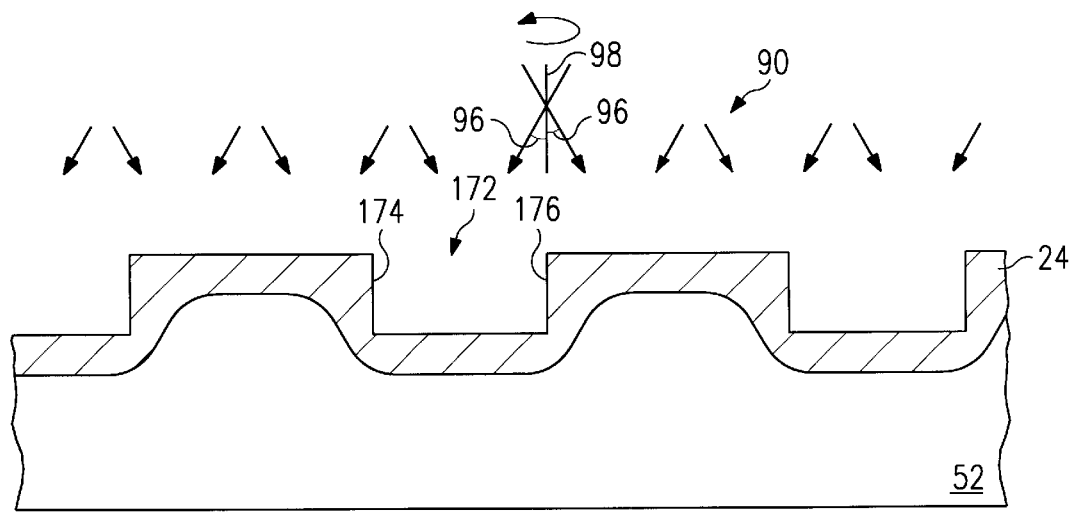
FIG. 5 is a cross section of a semiconductor substrate illustrating the fabrication of a source line by an angled ion implantation process in accordance with one embodiment of the present invention.

FIG. 5 is a cross section of the semiconductor substrate 52 illustrating the fabrication of the source line 24 with a slot trench 172 by an angled implantation process in accordance with one embodiment of the present invention. In this embodiment, the ion beam 90 impinges the semiconductor substrate 52 with ions at an angle 96 from an axis 98 normal to a axis in the semiconductor substrate 52. The semiconductor substrate 52 is generally rotated about the axis 98 during the implantation process. In one embodiment, the angle 96 is approximately 15°. It will be understood that the angle 96 may be varied between 5° and 45° without departing from the scope of the present invention.

A source line fabricated by some conventional fabrication processes has a high electrical resistance due to a discontinuity in the implanted conductive region as a result of the slot trench 172. The angled implantation process of the present invention reduces the discontinuity in the implanted conductive region forming the source line 24, thereby reducing the electrical resistance of the source line 24. The increased continuity and the reduced resistance are a result of the increased amount of dopant ions that are implanted into the semiconductor substrate 32 proximate a first and second sidewall surface 174 and 176, respectively, as a result of the angled implantation process.

Figure 6:
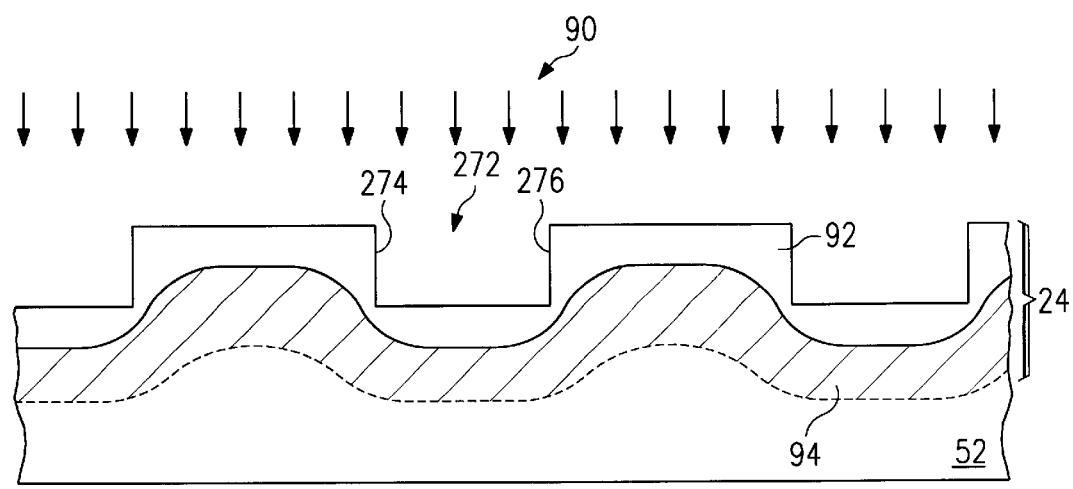
FIG. 6 is a cross section of a semiconductor substrate illustrating the fabrication of a source line by a variable energy implantation process in accordance with one embodiment of the present invention.

FIG. 6 is a cross section of the semiconductor substrate 52 illustrating the fabrication of the source line 24 with a slot trench 272 by a variable energy implantation process in accordance with one embodiment of the present invention. The slot trench 272 includes a first and second sidewall surfaces 274 and 276, respectively. The source line 24 is doped by an implantation process using an ion beam 90. The ion beam 90 is generally characterized by the energy, dose, and species of dopant material used in the ion beam 90. The energy and dose of the ion beam 90 depend on the species of dopant material and the depth that the dopant is to be implanted. In this embodiment of the present invention, the same species of dopant material is implanted within the surface of the semiconductor substrate 52 at varying depths. The varying depths of the dopant material form a source line 24 that has a lower electrical resistance than a source line fabricated by some conventional processes.

Similar to the previously described processes, the variable energy implantation process of the present invention reduces the discontinuity in the implanted conductive regions forming the source line 24, thereby reducing the electrical resistance of the source line 24. The increased continuity and the reduced resistance are a result of the increased amount of dopant ions that are implanted into the semiconductor substrate 52 proximate a first and second sidewall surface 274 and 276, respectively, as a result of the variable energy implantation process.

In a particular embodiment, the dopant material is implanted into the surface of the semiconductor substrate 52 at a first energy level and a second energy level using, for example, a low-energy and a mid-energy implantation process. As. illustrated in FIG. 6, the low-energy implantation process forms a first source line conductive region 92. The low-energy implantation process implants the dopant material to a depth on the order of 0.2 $\mu$m. The mid-energy implantation process forms a second source line conductive region 94. The mid-energy implantation process implants the dopant material to a depth on the order of approximately one-half of the trench depth. The first and second source line conductive regions 92 and 94, respectively, form the source line 24. The depth that the dopant material is implanted is generally dependant upon the depth of the trench 272. The greater the depth of the trench 272, the greater the required depth of implantation and thus the greater the implantation energies required to form the source line 24.

In an embodiment in which arsenic is used as the dopant material and the trench 272 is approximately 0.5 $\mu$m in depth, the energy required to implant the arsenic is approximately 100 KeV for the low-energy process and 300 KeV for the mid-energy implantation process. It will be understood that multiple dopant materials and multiple energy levels may be used to form the source line 24 without departing from the scope of the present invention.

The processes illustrated in FIGS. 4, 5, and 6, for fabricating the source line 24 in a memory array 9 may be used individually or in combination. For example, in one embodiment, the trench side walls 74 and 76 are fabricated at a sidewall angle of 800, the angle 96 of the ion beam 90 is 15°, and the dopant is arsenic implanted at low-energy and mid-energy levels of 100 KeV and 300 KeV, respectively. In a particular embodiment in which the depth of the STI structure 0.70 is 0.5 $\mu$m, the electrical resistance of the source line 24 is reduced by a factor of approximately forty from a corresponding source line fabricated by conventional processes. In a particular embodiment in which the depth of the STI structure 70 is 0.35 $\mu$m. the electrical resistance of the source line 24 is reduced by a factor of approximately four from a corresponding source line fabricated by conventional processes. In addition, the electrical resistance of the source line 24 is reduced below the electrical resistance of a corresponding source line fabricated using a LOCOS isolation structure. As described previously, a LOCOS structure is an alternative form of isolation structure that includes non-functional areas that waste space on the semiconductor substrate.

Although the present invention has been described with several embodiments, various changes and modifications may be suggested to one skilled in the art. It is intended that the present invention encompass such changes and modifications that follow within the scope of the appended claims.

What is claimed is:

1. A method of forming a continuous source line that crosses a trench in a memory circuit, the method comprising the steps of:

providing a semiconductor substrate comprising a plurality of gate stacks with adjacent semiconductor regions wherein each gate stack with adjacent semiconductor regions is isolated from other gate stack and adjacent semiconductor regions by shallow trench isolation structures;

exposing portions of the semiconductor substrate between some of the semiconductor regions adjacent to the gate stacks by removing regions of dielectric material from the shallow trench isolation structures; and simultaneously forming a source line and source regions adjacent to the gate stacks by implanting a dopant into the exposed portions of the semiconductor substrate using an ion beam directed at the exposed portions of the semiconductor substrate at an angle to form the source line and source regions, the angle formed between the ion beam and an axis normal to a surface of the semiconductor substrate.

2. The method of claim 1, wherein the angle between the ion beam and the axis normal to a surface of the semiconductor substrate is approximately 15°.

3. The method of claim 1, wherein the step of implanting a dopant into the semiconductor substrate comprises the steps of:

implanting a dopant at a first energy level into the semiconductor substrate using an ion beam directed at the semiconductor substrate at an angle to form a first source line conductive region, the angle formed between the ion beam and an axis normal to a surface of the semiconductor substrate; and implanting the dopant at a second energy level into the semiconductor substrate using the ion beam directed at the semiconductor substrate at the angle to form a second source line conductive region, the first energy level being greater than the second energy level, and the first and second source line conductive regions forming the source line.

4. The method of claim 3, wherein the dopant is arsenic implanted at a first energy level of approximately 100 KeV and at a second energy level of approximately 300 KeV.

5. A method of forming a semiconductor device component having a source line that crosses a trench, the method comprising the steps of:

forming the trench in a semiconductor substrate, the trench having a trapezoidal cross section comprising a first sidewall surface and a second sidewall surface, the first and second sidewall surfaces formed at a sidewall angle from an axis parallel to a surface of the semiconductor substrate, the sidewall angle in the range of 45° to 85°; and implanting a dopant into the semiconductor substrate to form the source line.

6. The method of claim 5, wherein the sidewall angle is approximately 80°.

7. The method of claim 5, and further comprising the step of filling the trench with a trench dielectric material after the step of implanting a dopant into the semiconductor substrate.

8. The method of claim 5, wherein the step of implanting a dopant into the semiconductor substrate comprises the step of implanting a dopant into the semiconductor substrate using an ion beam directed at the semiconductor substrate at an angle to form the source line, the angle formed between the ion beam and an axis normal to a surface of the semiconductor substrate.

9. The method of claim 5, wherein the step of implanting a dopant into the semiconductor substrate comprises the steps of:

implanting a dopant at a first energy level into the semiconductor substrate to form a first source line conductive region; and implanting the dopant at a second energy level into the semiconductor substrate to form a second source line conductive region, the first energy level being greater than the second energy level, and the first and second source line conductive regions forming the source line.

10. The method of claim 9, wherein the steps of implanting the dopant at a first and second energy level includes implanting the dopant using an ion beam directed at the semiconductor substrate at an angle, the angle formed between the ion beam and an axis normal to a surface of the semiconductor substrate.

11. The method of claim 9, wherein the dopant is arsenic implanted at a first energy level of approximately 100 KeV and at a second energy level of approximately 300 KeV.

* * * * *